(12) United States Patent
Kumnig et al.

(10) Patent No.: US 8,646,767 B2
(45) Date of Patent: Feb. 11, 2014

(54) DEVICE FOR HOLDING WAFER SHAPED ARTICLES

(75) Inventors: Franz Kumnig, Lieserbrucke (AT);
Thomas Wirnsberger, Seeboden (AT);
Rainer Obweger, Lind im Drautal (AT)

(73) Assignee: Lam Research AG, Villach (AT)

( * ) Notice: Subject to any disclaimer, the term of this patent is extended or adjusted under 35 U.S.C. 154(b) by 492 days.

(21) Appl. No.: 12/842,836

(22) Filed: Jul. 23, 2010

(65) Prior Publication Data

US 2012/0018940 A1    Jan. 26, 2012

(51) Int. Cl.
*B25B 5/08*    (2006.01)

(52) U.S. Cl.
USPC ............ 269/225; 269/229; 269/903; 475/347

(58) Field of Classification Search
USPC ....... 269/66, 225–227, 229, 231, 236, 254 R, 269/254 SC, 903; 475/346, 347
See application file for complete search history.

(56) References Cited

U.S. PATENT DOCUMENTS

| 3,021,731 | A | * | 2/1962 | Stoeckicht | 475/344 |
| 4,524,643 | A | * | 6/1985 | Ziegler et al. | 475/345 |
| 4,903,717 | A | * | 2/1990 | Sumnitsch | 134/99.1 |
| 5,513,668 | A | * | 5/1996 | Sumnitsch | 134/157 |
| 6,485,531 | B1 | | 11/2002 | Schob | |

FOREIGN PATENT DOCUMENTS

| JP | 2006-312225 A | 11/2006 |
| KR | 10-2002-0036386 A | 5/2002 |
| KR | 10-2009-0118672 A | 11/2009 |
| KR | 10-2010-0046830 A | 5/2010 |

OTHER PUBLICATIONS

International Preliminary Report on Patentability and Written Opinion, dated Mar. 21, 2012, from corresponding PCT application.

* cited by examiner

*Primary Examiner* — Lee D Wilson
*Assistant Examiner* — Adam Barlow
(74) *Attorney, Agent, or Firm* — Young & Thompson

(57) ABSTRACT

A device for holding wafer-shaped articles, such as semiconductor wafers, is equipped with a series of pins that are brought into contact with a peripheral edge of the wafer-shaped article, under control of a common gear ring or a series of conjointly operated gear sectors. In the regions of the gear ring or gear sectors engaging the pin assemblies, those elements are designed to yield more readily than other regions of the gear ring or gear sectors, to accommodate differential thermal expansion of the chuck components in the vicinity of the pin assemblies.

15 Claims, 4 Drawing Sheets

Fig. 1d
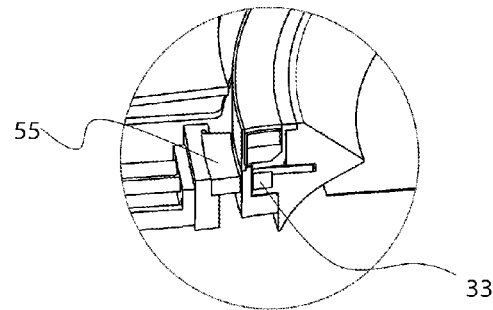
Fig. 2
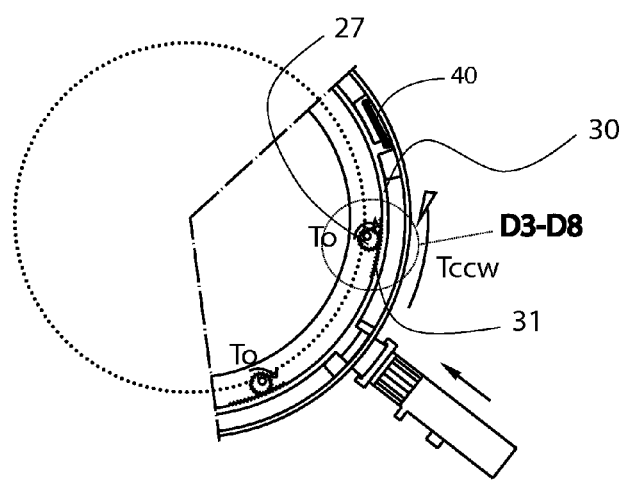
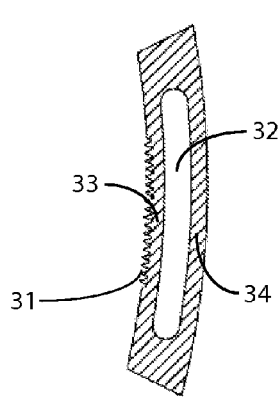
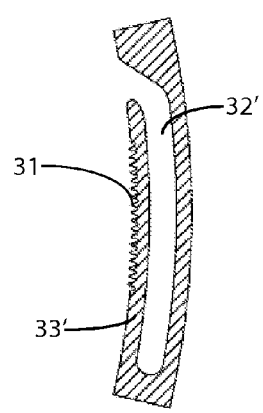
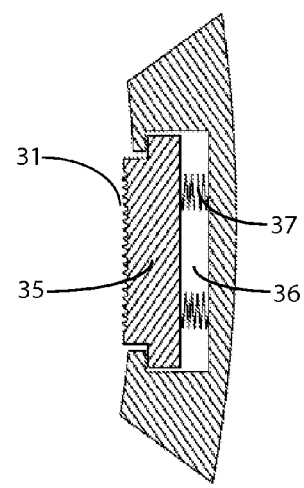
Fig. 3          Fig. 4
Fig. 5

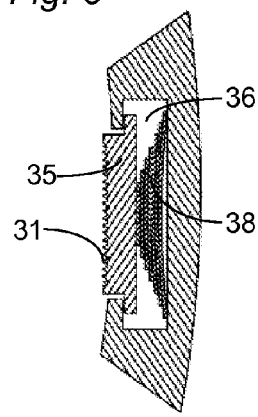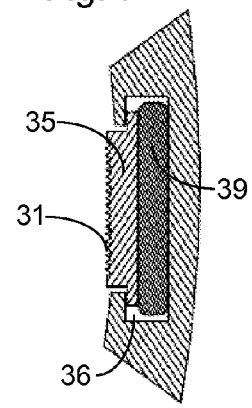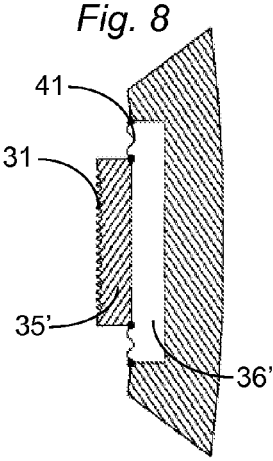
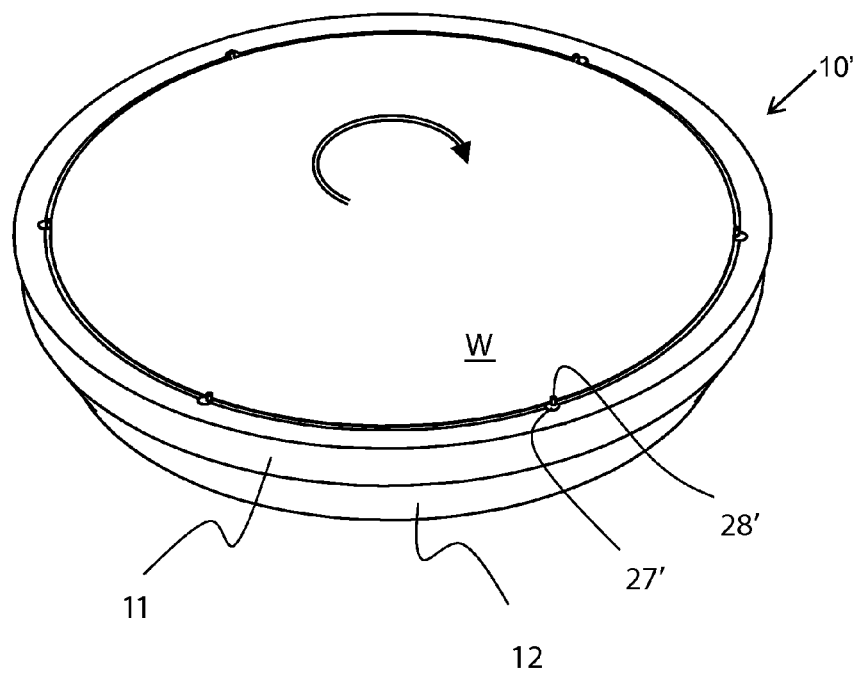
Fig. 9

DEVICE FOR HOLDING WAFER SHAPED ARTICLES

BACKGROUND OF THE INVENTION

The invention relates to devices for holding wafer-shaped articles, such as semiconductor wafers.

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

The patents referenced above operate on the Bernoulli principle, such that the wafer receives subjacent support from a gas cushion rather than by contact with the chuck. Such chucks nevertheless ordinarily include a circular series of pins that are positioned radially outwardly of a wafer positioned on the chuck. Those pins prevent lateral displacement of the wafer relative to the chuck.

As described in U.S. Pat. No. 4,903,717, each pin projects upwardly from a respective pivotal base. The axes of the pin and base are vertical but offset from one another such that pivoting of the base causes the associated pin to travel along a circular arc and hence be adjustable in its radial position. The pivot bases are each provided with gear teeth, which mesh with the teeth of a common gear ring that is coaxial with the axis of rotation of the chuck. Rotation of the gear ring relative to the chuck thus causes all of the pins to move conjointly and to the same extent.

That construction permits the pins to be moved radially outwardly for placement or removal of a wafer, and then to be moved radially inwardly to be brought into contact with the peripheral edge of a wafer. Such contact prevents not only lateral displacement of the wafer relative to the chuck, but also relative rotation between the wafer and chuck as the chuck is spun.

Other spin chucks operate under control of magnetic fields, by fashioning the chuck body as a magnetic rotor positioned coaxially within a surrounding annular magnetic stator, as described for example in U.S. Pat. No. 6,485,531. In such chucks the rotary head supports the wafer. The present assignee has designed such chucks utilizing pins having characteristics in common with those described above, but which serve in this context also to support the weight of the wafer.

Spin chucks are subjected to extreme temperatures and highly acidic etching solutions in use. Designs that perform without incident under one set of processing conditions might perform with less consistency under different processing conditions.

SUMMARY OF THE INVENTION

The present inventors have discovered that, in chucks of the type described above, the pins do not always open and close reliably under extreme processing conditions. According to the present invention, a device for holding wafer-shaped articles, such as semiconductor wafers, is equipped with a series of pins that are brought into contact with a peripheral edge of the wafer-shaped article, under control of a common gear ring or a series of conjointly operated gear sectors. In the regions of the gear ring or gear sectors engaging the pin assemblies, those elements are designed to yield more readily than other regions of the gear ring or gear sectors, to accommodate differential thermal expansion of the chuck components in the vicinity of the pin assemblies.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 1b is a perspective view, also partly in section, of the detail D1b of FIG. 1a;

FIG. 1d is a view corresponding to that of FIG. 1e, in which the chuck is in a different angular orientation to expose a pin assembly;

FIG. 2 is a plan view, partly broken away, illustrating the connection between the gear ring, pin assemblies and the chuck, and the interaction of the gear ring and its associated control mechanism;

FIG. 3 is a radial sectional view of a first example of a gear ring or gear sector according to the invention;

FIG. 4 is a radial sectional view of a second example of a gear ring or gear sector according to the invention;

FIG. 5 is a radial sectional view of a third example of a gear ring or gear sector according to the invention;

FIG. 6 is a radial sectional view of a fourth example of a gear ring or gear sector according to the invention;

FIG. 7 is a radial sectional view of a fifth example of a gear ring or gear sector according to the invention;

FIG. 8 is a radial sectional view of a sixth example of a gear ring or gear sector according to the invention.

FIG. 9 is a perspective view from above of a second embodiment of a chuck according to the invention;

FIG. 10b is a schematic perspective view of one example of the gear ring 30' within detail D10b of FIG. 10a.

DETAILED DESCRIPTION OF PREFERRED EMBODIMENTS

Figure 1A:
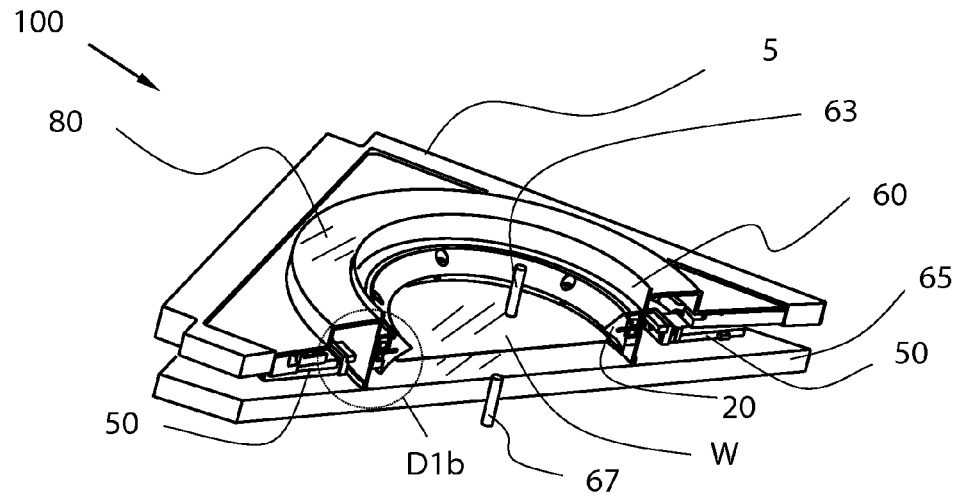
FIG. 1a is a perspective view, partly in section, illustrating a device according to one embodiment of the invention.

The device 100 of FIG. 1a comprises a chamber, an annular chuck 20 for gripping and rotating a wafer (disc-like article) and a stator 80. The chamber comprises a cylindrical wall 60, a bottom plate 65 and a top plate (not shown). An upper dispensing tube 63 is led through the top plate and a lower dispensing tube 67 through the bottom plate 65.

Stator 80 is mounted to a stator base plate 5 and is concentric with the cylindrical wall 60. The stator base plate 5 can be moved axially along the axis of the cylindrical wall 60, e.g. with pneumatic lifting devices. The stator base plate 5 and the stator 80 mounted thereto have central openings, whose diameter is greater than the outer diameter of the cylindrical wall 60. The top plate can also be moved axially to open the chamber. In its closed position the top plate is sealed against the cylindrical wall 60.

The stator 80 comprises several coils 84 for axial and radial orientation and for driving the rotor 85, which is part of the annular chuck. Such arrangement is further described in U.S. Pat. No. 6,485,531. The diameter of the annular chuck 20 is less than the inner diameter of the cylindrical wall so that it can freely levitate and rotate within the cylindrical wall 60. The annular chuck 20 comprises an inner chuck base body 21 with an annular groove circumferentially surrounding the outside of the inner chuck base body 21, with the annular groove receiving the gear ring 30. The gear ring 30 is preferably made of PEEK, aluminum, or stainless steel.

Gear ring 30 comprises inwardly facing teeth 31. The inwardly facing teeth 31 in turn drive the teeth of a pin shaft 27 (see FIG. 1c).

This embodiment has six downwardly oriented pin shafts 27, each of which has a small gear, which is driven by the gear ring 30. The pin shafts 27 are mounted so that they can turn about an axis A, which is parallel to the rotation axis of the annular chuck.

A pin 28 is mounted to or formed integrally with each pin shaft 27, at a position that is eccentric with respect to the axis of rotation A of the pin shaft 27. Consequently, the pins 28 are displaced radially of the chuck when the pin shafts 27 are turned by the gear ring 30. As the pins and the gear ring 30 are both carried by the chuck base body 21, the pins shafts 27 are rotated by the gear ring 30 only when the gear ring 30 rotates relative to the chuck base body.

Pins 28 are positioned so as to contact a wafer W on its peripheral edge. As the pins 28 also support the weight of the wafer W, the pins 28 may either be cylindrical in shape or have recessed portions on their radially inwardly facing sides contacting the wafer edge, to prevent axial displacement of the wafer W relative to the pins 28 when the wafer is being gripped.

In order to mount the gear ring 30 into the annular groove of the chuck base body 21 the gear ring 30 consists of two separate segments, which are fixed together when inserted into the annular groove. The chuck base body 21 and the gear ring 30 are connected via one or more helical springs 40 (see FIG. 2) so that the gear ring 30 urges the pins 28 into their radially innermost positions, corresponding to the gripping of a wafer.

Figure 1B:
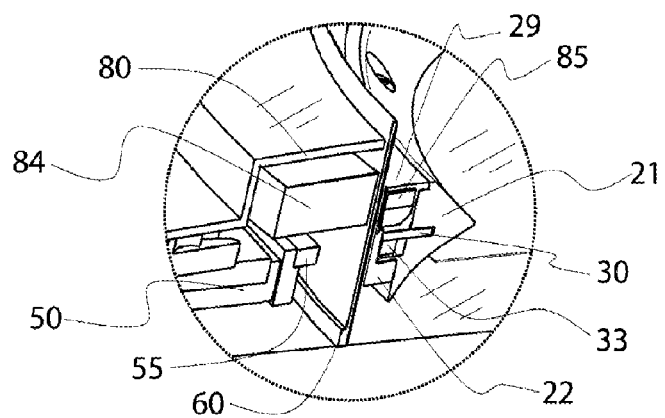

Two permanent magnets 33 (see FIG. 1b) are mounted to the tooth gear ring 30. A plurality of at least twenty-four rotor magnets 85, which are permanent magnets, are evenly arranged around the chuck base body 21. These rotor magnets 85 are part of the drive and positioning unit, namely, part of the rotor (elements of the active bearing), which is mounted to the chuck base body 21.

The plurality of rotor magnets 85 and the gear ring 30 carrying the permanent magnets 33 are encapsulated in a hollow annular space provided by the chuck base body 21, outer lower chuck cover 22, and the rotor magnet cover 29. Such rotor magnet cover 29 can be a stainless steal jacket. The covers 22 and 29 are annular and concentric with the chuck base body 21.

Figure 1C:
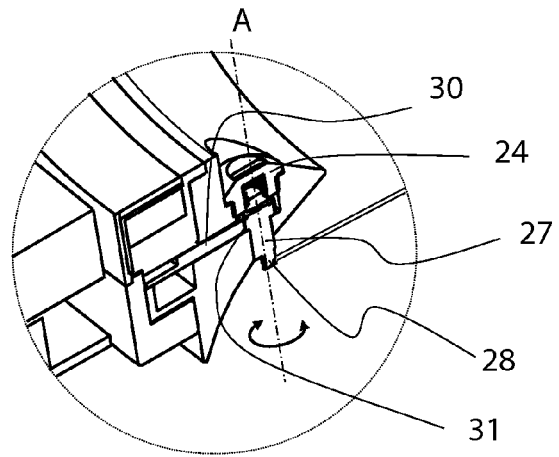
FIG. 1c is a view corresponding to that of FIG. 1b, in which the stator and hence also the chuck have been elevated relative to the cylindrical wall of the process chamber.

When assembling the chuck 20 the pin shafts 27 are inserted from above into their respective seats so that the pin shafts tightly seal against the chuck base body 21 as shown in FIG. 1c. Each pin shaft 27 is fixed in position with a screw 24. Additionally, each pin shaft may be pressed into its seat by a helical spring between the pin shaft and the screw.

Attached to the stator base plate 5 is the stator and active positioning unit 80 which is concentrically arranged with respect to the cylindrical wall 60. The positioning unit 80 corresponds with the rotor magnets 85 therefore levitating, positioning and rotating the chuck 20.

Below the active positioning unit 80 there are two pneumatic cylinders 50 mounted to the stator base plate 5. On the distal ends of the rods of the pneumatic cylinders 50 locking magnets 55 (permanent magnets) are arranged. The locking magnets correspond to the permanent magnets 33 of the gear ring 30. The pneumatic cylinders 50 are arranged so that the locking magnets 55 can be radially moved with respect to the axis of the cylindrical wall 60.

When the pins are to be opened e.g. to release a wafer the following procedure is conducted: the stator base plate 5 is lifted and therewith the levitating chuck 20 so that the cylindrical wall 60 is no longer in the gap between the locking magnets 55 and the chuck 20 (see FIG. 1c). Thereafter the pneumatic cylinders 50 move the locking magnets 55 in close proximity to the chuck 20 and the chuck is turned so that the permanent magnets 33 and therewith the gear ring 30 is locked by the locking magnets. Now the chuck is turned while the gear ring stands still and thus the pins 28 open. Alternatively the chuck base body might stand still while the pneumatic cylinders are moved so that the locking magnets tangentially turn (along the circumference of the chuck), whereby the gear ring is turned.

However, as described above, the present inventors have discovered that, at higher process temperatures, the pins of a chuck such as that described could fail to open upon completion of processing, or when time to effect a wafer shift during processing. The pins and their associated activating mechanism are not observable when the chuck is in use, as the processing chamber might contain hot sulfuric acid or water superheated to temperatures on the order of 120° C. Moreover, the gear ring 30 of this embodiment is seated in a groove in the chuck body 21.

The present inventors nevertheless identified the source of this problem as being that the ring gear 230, which is preferably made of stainless steel, undergoes thermal expansion at high temperatures to a lesser extent than does the chuck base body 21, which is preferably made of plastic, such as PVDF (polyvinylidene fluoride), or ECTFE (ethylene-chlorotrifluoroethylene). As the pin shafts 27 are fitted in the chuck base body 21, the relatively greater expansion of the chuck base body 21 would displace the pin assemblies radially outwardly, without a corresponding displacement of the gear ring 30, such that the pins 28 would be pressed against the teeth of gear ring 30 with sufficient force to cause the gear ring 30 to jam. The phenomenon can also be understood as the gear ring 30 urging the pin assemblies radially inwardly such that the pin shafts 27 would seize within the expanded chuck base body 21. As the pin assemblies are in meshing engagement with the gear ring 30, the result is the same, i.e., seizing of the gear ring 30.

Having identified the source of the problem, the inventors devised various solutions thereto involving weakening the gear ring in at least those regions where the gear ring contacts the respective pin assemblies, to accommodate the high temperature displacement of the pin assemblies arising from the thermal expansion of the chuck base body.

FIGS. 3-8 illustrate several examples of structures designed to implement the present invention. Each of those figures shows in radial section a portion of ring gear 30 that includes the region contacting a respective pin assembly. Thus, in the present embodiment, the structure depicted in each of these figures would be repeated six times over the circumference of the gear ring 30, with the six sectors being interconnected by solid or unmodified regions of the gear ring 30 of approximately the same width as shown in those figures.

The solution to that problem was that the area (31), where the tooth gear (30) touches the pin shaft (27), was embodied in a weaker form meaning having an area with a decreased young module.

In FIG. 3, behind the teeth 31 there is an enclosed cut-out 32 that defines narrower region 33, 34 that are thereby significantly weakened. The material of the ring gear 30 has sufficient elasticity that the narrower region 33 will deflect radially outwardly upon thermal expansion of chuck base body 21 and associated displacement of pin assembly 27, yet will return to its initial position as the chuck base body 21 cools and contracts.

In FIG. 4 the cut-out 32' is not fully enclosed, so that the weakened region 33' is in a cantilever configuration.

In FIG. 5 the teeth 31 are formed in a separate block 35 that is fitted within a cavity 36 formed in the gear ring 30. Coil springs 37 urge the block 35 radially inwardly into meshing engagement with pin assembly 27, yet accommodate the radially outward displacement of the pin assemblies 27 upon thermal expansion of chuck base body 21.

The examples of FIGS. 6-8 operate on essentially the same principle as that of FIG. 5. In FIG. 6, the coil springs 37 of FIG. 5 are replaced by leaf spring 38. In FIG. 7, the springs of he previous examples are replaced by a body of elastomeric material 39 whose elasticity in compression accommodates outward displacement of the pin assemblies as would the springs of the previous examples. Lastly, FIG. 8 shows block 35' not fitted within cavity 36' but rather connected to the edges of that cavity via strip springs 41.

Common to each of the examples of FIGS. 3-8 is that the teeth area that drives the pin shaft when opening and closing the pins is significantly weakened relative to the full radial width of the ring gear in the adjacent regions. Thus, the weakened regions can be considered to have a lower effective Young's modulus than the adjacent non-weakened regions.

With all these embodiments the maximum force that is applied to each small gear of the pin shaft is limited by these "weakened" areas, and is preferably limited to a value in the range of 5 to 20 N.

FIG. 9 shows a spin chuck 10' that operates on the Bernoulli principle, with a wafer W in position. Pin assemblies 27' are mounted in the upper chuck body 11, and the eccentric pins 28' that engage the wafer edge project upwardly from the upper chuck body 11. Upper chuck body 11 is joined to lower chuck body 12, which in turn is mechanically driven via a shaft (not shown).

Figure 10A:
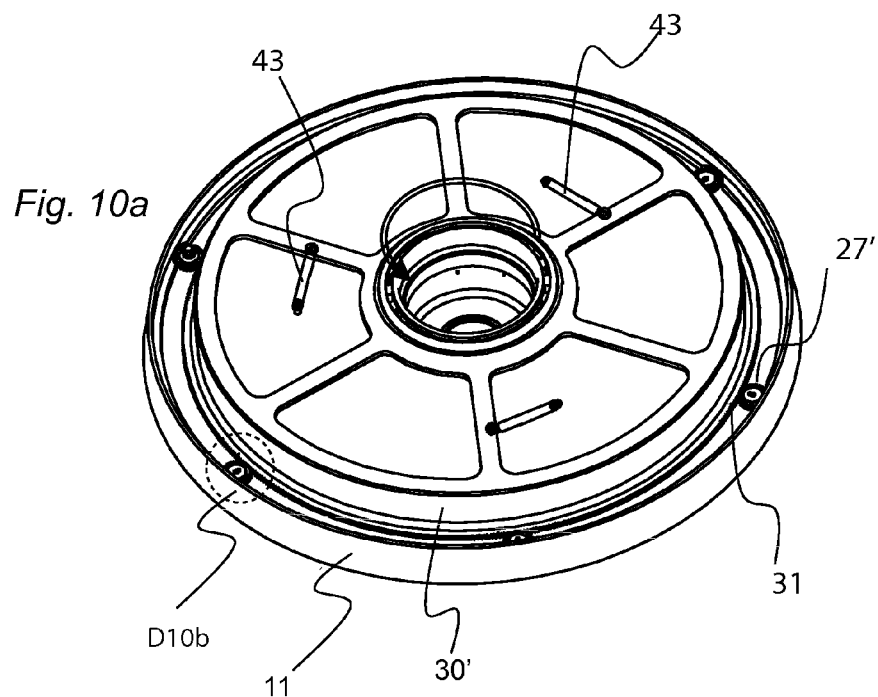
FIG. 10a is a perspective view from below of the FIG. 9 embodiment.

In FIG. 10a the chuck 10' is shown from below, with the lower base body 12 having been removed. This reveals the somewhat different gear ring 30' of this embodiment, in which teeth 31 are provided on the radially outer edge of the gear ring, in contrast to the previous embodiments. The circular arrow depicts the clockwise rotation of the chuck, although the arrow itself is directed counterclockwise due to the chuck being shown from below in this figure.

Teeth 31 mesh with the corresponding teeth on pin assemblies 27', while the body of the pin assembly 27 is seated within the upper base body 11. Coil springs 43 connected between the gear ring 30' and the upper base body 11 urge the gear ring toward an angular orientation relative to the upper base body 11 in which the pins 28' projecting from the upper surface of the upper base body 11 are in their radially innermost position, corresponding to gripping a wafer W during use of the chuck.

Figure 10B:
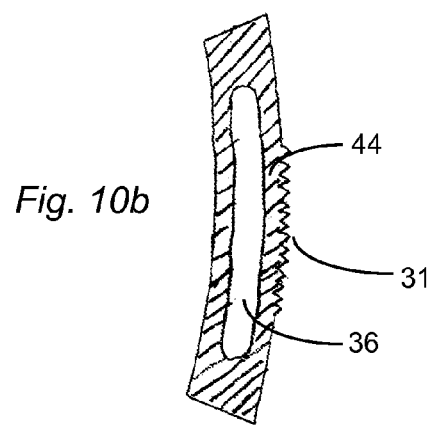

The detail D10b of FIG. 10a is show in schematic cross-section in FIG. 10b, in which only the gear ring is depicted for ease of understanding. FIG. 10b is similar to FIG. 3, but shows the teeth 31 on the radially outward narrow region 44, as the pin assemblies 27 of this embodiment lie radially outward of the gear ring 30'. Without further depiction it will be recognized that the examples of FIGS. 4-8 can be similarly adapted for this embodiment.

Although the present invention has been described in connection with spin chucks it may also be used in a non-rotating chuck. Furthermore, although the invention has described in connection with a chuck used for wet chemical processing, it could also be used for dry processes.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A device for holding a wafer-shaped article, comprising a plurality of movable contact elements having a projecting portion for contacting a wafer-shaped article and a mounting portion fitted within a body of said device, and a gear mechanism driving the contact elements in unison between a first position in which they contact a wafer-shaped article positioned on the device, and a second non-contact position, wherein the gear mechanism comprises, in at least one region engaging one of said plurality of contact elements, a construction that more readily yields to lateral displacement of said plurality of contact elements than other regions of said gear mechanism adjacent the at least one region wherein said gear mechanism has includes position on a body having teeth parallel to an elongated slot within said body.

2. The device according to claim 1, wherein the contact elements are a series of pins that are conjointly movable from said second position to said first position.

3. The device according to claim 1, wherein said body of the device is made of plastic.

4. The device according to claim 1, wherein said device is a spin chuck in a process module for single wafer wet processing.

5. The device according to claim 2, wherein the pins are arranged in a circular series, and each pin projects upwardly from a respective pivotal base along an axis parallel to and offset from a pivot axis of said pivotal base.

6. The device according to claim 1, wherein said gear mechanism is a gear ring having teeth on a radially inward edge thereof, said teeth being in meshing engagement with corresponding teeth on said contact elements.

7. The device according to claim 1, wherein said gear mechanism is a gear ring having teeth on a radially outward edge thereof, said teeth being in meshing engagement with corresponding teeth on said contact elements.

8. The device according to claim 1, wherein said construction is configured such that the gear mechanism acts on the contact elements with a maximum force in the range of 5 to 20 N.

9. The device according to claim 1, wherein said construction is a cut-out in said gear mechanism defining a narrowed region whose Young's modulus is less than that of said other regions.

10. The device according to claim 9, wherein the cutout is enclosed such that no outer edge surface of said gear mechanism is thereby interrupted.

11. The device according to claim 9, wherein the cut-out interrupts an edge surface of the gear mechanism such that the narrowed region is of a cantilever form.

12. The device according to claim 1, wherein said construction is an insert fitted with a cavity of said gear mechanism, said insert comprising gear teeth in meshing engagement with corresponding teeth of said at least one contact element, said insert being urged into meshing engagement with said corresponding teeth by at least one resilient element, said at least one resilient element yielding to displacement of said at least one contact element in a direction toward said cavity.

13. The device according to claim 12, wherein said at least one resilient element is at least one spring.

14. The device according to claim 12, wherein said at least one resilient element is a body of elastomeric material fitted within said cavity.

15. A device for holding a wafer-shaped article, comprising a plurality of movable pin assemblies each having a projecting portion for contacting a wafer-shaped article and a mounting portion fitted within a body of said device, and a gear mechanism driving the pin assemblies in unison between a first position in which the projecting portions contact a wafer-shaped article positioned on the device, and a second non-contact position, wherein the gear mechanism comprises, in at least one region engaging one of said plurality of pin assemblies, means for accommodating lateral displacement of said plurality of pin assemblies more readily than in other regions of said gear mechanism adjacent the at least one region wherein said gear mechanism has includes position on a body having teeth parallel to an elongated slot within said body.

\* \* \* \* \*